United States Patent
Gijs et al.

(10) Patent No.: US 6,205,008 B1
(45) Date of Patent: Mar. 20, 2001

(54) MAGNETIC-RESISTANCE DEVICE, AND MAGNETIC HEAD EMPLOYING SUCH A DEVICE

(75) Inventors: Martinus A. M. Gijs; Paul J. Kelly, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 1094 days.

(21) Appl. No.: 08/649,909

(22) Filed: May 16, 1996

Related U.S. Application Data

(63) Continuation of application No. 08/314,558, filed on Sep. 28, 1994, now abandoned.

(30) Foreign Application Priority Data

Oct. 6, 1993 (EP) ................................................... 93202835

(51) Int. Cl.⁷ ....................................................... G11B 5/39
(52) U.S. Cl. ....................................... 360/324; 360/324.1
(58) Field of Search .................................... 360/113, 119, 360/324, 324.1, 324.11, 324.12, 324.2; 338/32 R; 324/207.21, 252; 365/157, 158

(56) References Cited

U.S. PATENT DOCUMENTS

| | | | |
|---|---|---|---|
| 4,663,607 | * 5/1987 | Kitada et al. | 338/32 H |
| 4,754,354 | * 6/1988 | Jeffers | 360/113 |
| 5,134,533 | 7/1992 | Friedrich et al. | 360/113 |
| 5,159,513 | * 10/1992 | Dieny et al. | 360/113 |
| 5,287,238 | * 2/1994 | Baumgart et al. | 360/113 |
| 5,304,975 | * 4/1994 | Saito et al. | 360/113 |
| 5,416,353 | * 5/1995 | Kamiguchi et al. | 257/421 |

OTHER PUBLICATIONS

"Changes in the Electrical Resistivity of Fe–C/Al$_2$O$_3$/Fe–Ru Multilayered Films Due to a Magnetic Field", by R. Nakatani and M Kitada, Jour. of Materials Science Letters 10 (1991), pp. 827–828.

"Conductance and Exchange Coupling of Two Ferromagnets Separated by a Tunneling Barrier", by J. Slonczewski, Physical Review Letters, vol. 39, No. 10, Apr. 1, 1989, pp. 6995–7002.

"Giant Magnetoresistance of (001) Fe/(001) Cr Magnetic Superlattices", by M. Baibich et al, Physical Review Letters, vol. 61, No. 21, Nov. 21, 1988, pp. 2472–2475.

"Perpendicular Giant Magnetoresistance of Microstructured Fe/Cr Magnetic Multilayers from 4.2 to 300K", by M. Gijs et al, Physical Review Letters, vol. 70, No. 21, May 24, 1993, pp. 3343–3346.

* cited by examiner

Primary Examiner—David L. Ometz
(74) Attorney, Agent, or Firm—Norman N. Spain

(57) ABSTRACT

A magneto-resistance device comprising two layers of ferromagnetic material mutually separated by at least one interposed layer of non-ferromagnetic material, in which at least one of the layers of ferromagnetic material comprises half-metallic material, and preferably both ferromagnetic layers are principally comprised of half-metallic material.

9 Claims, 3 Drawing Sheets

MAGNETIC-RESISTANCE DEVICE, AND MAGNETIC HEAD EMPLOYING SUCH A DEVICE

This is a continuation of application Ser. No. 08/314,558, filed Sep. 28, 1994 now abandoned.

BACKGROUND OF THE INVENTION

The invention relates to a magneto-resistance device comprising two layers of ferromagnetic material mutually separated by at least one interposed layer of non-ferromagnetic material.

The invention also relates to a magnetic head employing such a device.

Magneto-resistance is that phenomenon whereby the electrical resistance measured along a given path within a suitable material is found to be influenced by the presence of a magnetic field intersecting that material. The phenomenon can thus be exploited to transcribe probed magnetic field variations into corresponding resistance variations within the material, thereby lending itself to application in magnetic field sensors and magnetic heads. Such magnetic heads are employed to transfer data to and from a magnetic recording medium, such as a magnetic tape or disc.

The magnitude of the magneto-resistance effect along a given path in a particular material is rendered by the formula:

$$MR = \frac{(R_L - R_S)}{R_L}$$

in which $R_L$ and $R_S$ are, respectively, the largest and smallest electrical resistances measurable along the said path in a variable magnetic field, at a given temperature. The value of MR is usually expressed as a percentage, and is preferably as large as possible so as to yield maximum attainable sensitivity in sensor applications such as those mentioned above.

The magneto-resistance effect in a layered structure can be investigated using at least two measuring geometries. The first such geometry is the so-called Current In Plane (CIP) geometry, whereby the electrical resistance of the device is measured using a method in which an electrical voltage gradient is applied in a direction substantially parallel to the plane of the device's constituent layers. The second such geometry is the so-called Current Perpendicular to Plane (CPP) geometry, whereby the electrical resistance of the device is measured using a method in which an electrical voltage gradient is applied in a direction substantially perpendicular to the device's constituent layers. For a given device, the magneto-resistance effect measured using the CPP geometry is generally larger than that measured using the CIP geometry, by as much as a factor of three. See, for example, the article by Gijs et al. in Phys. Rev. Lett. 70 (1993), pages 3343–3346.

A trilayer structure of the kind described in the opening paragraph is suitable for exploiting the so-called spin-valve magneto-resistance effect, whereby the resistivity of the structure is found to be influenced by the mutual orientation of the (net) magnetisations of the two layers of ferromagnetic material. The structure is then preferably embodied in such a way that an external magnetic field can be used to easily alter this mutual orientation. Such an embodiment can be achieved in at least three different ways, as follows:

(a) The two ferromagnetic layers can be antiferromagnetically coupled across the interposed non-ferromagnetic layer, so that their (net) magnetisations are mutually anti-parallel in the absence of an external magnetic field. A magnetic field applied parallel to the magnetisation of one of the ferromagnetic layers can then be used to reverse the magnetisation in the other ferromagnetic layer, thereby forcing both magnetisations into mutually parallel configuration;

(b) One of the ferromagnetic layers can be exchange-biased to an additionally present anti-ferromagnetic biasing layer in such a manner that the magnetisation of the other ferromagnetic layer can be independently oriented by an external magnetic field, into either anti-parallel or parallel configuration with the magnetisation of the exchange biased layer;

(c) The two ferromagnetic layers can be embodied to have considerably different magnetic coercivities. This can be achieved, for example, by the addition of differing concentrations of suitable foreign substances to the material of each ferromagnetic layer. A magnetic field of suitably chosen strength can then be used to separately orient the magnetisation of the ferromagnetic layer of lower magnetic coercivity, without changing the magnetisation-direction in the ferromagnetic layer of higher magnetic coercivity.

A magneto-resistance device of the type indicated in the opening paragraph is elucidated in an article by Nakatani and Kitada in J. Mat. Sci. Lett. 10 (1991), pages 827–828. In this known device, an electrically insulating $Al_2O_3$ layer is interposed between two ferromagnetic Fe layers with in-plane magnetisation, and the magneto-resistance effect of the combination is measured using the CPP geometry. One of the Fe layers is doped with 1.7 at. % Ru in order to increase its magnetic coercivity, whereas the magnetic coercivity of the other Fe layer is reduced by doping its Fe with 2.0 at. % C. The resulting trilayer structure is therefore of the type i(c) elucidated above. The doped Fe layers are each 100 nm thick, whereas the interposed $Al_2O_3$ layer is only 10 nm thick. Such a thin insulating layer acts as a tunnelling barrier between the conducting Fe layers which border it. In other words, even though the bulk material of the layer is an insulator, the thickness of the layer itself is small enough to allow a statistically significant number of electrons to tunnel across it.

The CPP electrical resistivity of this known trilayer device attains a minimum value when the net magnetisations of the two doped Fe layers are mutually parallel, and a maximum value when these two magnetisations are anti-parallel. Such spin-dependent tunnelling behaviour is rigorously discussed by Slonczewski in Phys. Rev. B 39 (1989), pages 6995–7002, where it is concluded (equation (6.1), page 7000) that the CPP conductance (G) of the trilayer satisfies the approximate relationship:

$$G = G_0(1 + \epsilon \cos \theta)$$

Here, $G_0$ and $\epsilon$ are constants ($\epsilon < 1$), and $\theta$ is the in-plane angle between the (net) magnetisation vectors of the two ferromagnetic layers. The fractional difference between the conductances of the trilayer for mutually parallel and mutually anti-parallel magnetisation configurations is therefore $2\epsilon$.

A disadvantage of the spin-dependent tunnelling effect on which the known device is based is that the value of $\epsilon$ is generally very small. As a result, the room-temperature CPP magneto-resistance effect in that device is only about 1.0%. Such a low value greatly limits the sensitivity of potential magnetic field sensors employing the known device.

Another known spin-valve magneto-resistance device is disclosed in U.S. Pat. No. 5,134,533, in which layers of in-plane ferromagnetic material such as Fe, Co or Ni are antiferromagnetically coupled across interposed layers of electrically conductive non-ferromagnetic material such as Cr, V or Ti, thereby forming an alternating multilayer arrangement containing a plurality of the basic trilayer structures of the type (a) elucidated above. In this case, the electrical resistivity once again attains a minimum value when the net magnetisations of the two ferromagnetic layers are mutually parallel, and a maximum value when these two magnetisations are anti-parallel.

The magneto-resistance effect in this second known device is caused by spin-dependent scattering phenomena, whereby the extent to which conduction electrons are resistively scattered in the device is determined by the direction of their intrinsic spin in relation to the magnetisation-direction of the ferromagnetic layers. The effect is explained in more detail by Baibich et al. in Phys. Rev. Lett. 61 (1988), pages 2472–2475, in particular page 2474. Once again, the magnitude of the effect is quite small, so that the room-temperature CIP magneto-resistance of this second known device is only about 10%.

OBJECTS AND SUMMARY OF THE INVENTION

It is an object of the invention to provide a magneto-resistance device demonstrating a significantly larger magneto-resistance effect than that obtained with the known devices.

It is a further object of the invention to provide a magneto-resistance device which can demonstrate a much larger electrical resistance than a known device of similar form and dimensions, thereby reducing the electrical power consumption of the inventive device compared to that of the known devices.

In accordance with the invention, these and other objects are achieved in a magneto-resistance device of the type described in the opening paragraph, characterised in that at least one of the layers of ferromagnetic material comprises half-metallic material.

Examples of half-metallic materials are the so-called Heusler alloys, which have the composition XMnZ or $X_2MnZ$, in which X is an element such as Cu, Ni, Pt, Pd, Co or Fe, and Z is an element such as Sb, Sn, In or Ga. Additional examples of half-metallic materials are $Fe_3O_4$, $CrO_2$ and $KCrSe_2$. All of these exemplary materials are ferromagnetic. Many other such materials are also known, and these exemplary lists are by no means to be considered as being exhaustive.

Conduction electrons within a ferromagnetic metal can be classified into two independent spin states, whereby those electrons with an intrinsic spin parallel to the local net magnetisation are termed "spin-up" electrons, while those electrons with an intrinsic spin anti-parallel to the local net magnetisation are called "spin-down" electrons. For the special case of half-metallic ferromagnetic materials, band structure calculations reveal a striking discrepancy between these spin-up and spin-down states. The bands for electrons of one spin state are intersected by the Ferini level, at which a non-zero density of states therefore exists; such electrons can thus function as conduction electrons. However, the bands for electrons of the other spin state have a forbidden energy zone at the Fermi level, around which the density of states is therefore zero; these electrons thus cannot function as (low-energy) conduction electrons. As a result, half-metallic materials behave as metals for electrons of one spin state, but act as semi-conductors (insulators) for electrons of the other spin state. In other words, the conduction electrons in half-metallic materials are 100% spin-polarised.

On the basis of the phenomena described in the previous paragraph, the use of half-metals in a magneto-resistance device according to the present invention effectively provides an enormous amplification of the subtle spin-dependent resistivity effects exploited in the known devices described hereabove.

A trilayer structure of type (a), (b) or (c) in which two layers of pure half-metallic ferromagnetic material are separated by an interposed layer of non-ferromagnetic material can be used to obtain a huge spin-valve magneto-resistance effect. For example, in the case of the CPP geometry:

(1) If the magnetisation vectors of the ferromagnetic layers are mutually parallel, then both these layers will behave as metals for electrons of a certain spin state (in the case of $Fe_3O_4$, for example, this will be the spin-down state). Electrons of this particular spin state will thus be able to traverse the entire trilayer in a substantially perpendicular direction, whereas electrons of the opposite spin state will not. The electrical resistance in the former case will be essentially determined by the thickness and material of the non-ferromagnetic interposed layer;

(2) If the magnetisation vectors of the ferromagnetic layers are mutually anti-parallel, then, for electrons of each spin state, one of these layers will behave as a metal, whereas the other will behave as an insulator. As a result, electrons of neither spin state will in this case be able to traverse the entire trilayer in a substantially perpendicular direction. The measured electrical resistance will thus be essentially infinite;

(3) Statistically, a small current of electrons will always be able to tunnel through the entire trilayer structure, regardless of its magnetisation configuration. In addition, spin-flip scattering events can also occur in the interposed non-ferromagnetic layer, thereby causing the spin state of a small fraction of scattered electrons to undergo a reversal. In the case of an anti-parallel magnetisation configuration in the trilayer (point (2) above), an electron which has already traversed one of the ferromagnetic layers will, if it undergoes a spin-flip, also be able to traverse the second ferromagnetic layer, whereby a small leakage current arises. However, by ensuring that the interposed nonferromagnetic layer is relatively thin, such spin-flip occurrences are kept to a minimum. In addition, by making the ferromagnetic layers relatively thick, tunnelling events through the entire trilayer are limited. The magneto-resistance effect of the trilayer is then essentially 100%.

If the ferromagnetic layers are not entirely comprised of half-metallic material, but only partially so, then the magnitude of the observed magneto-resistance effect will be correspondingly reduced. An advantageous embodiment of the magneto-resistance device according to the invention is therefore characterised in that both ferromagnetic layers are principally comprised of half-metallic material. Use of the term "principally" here should be interpreted as indicating that the ferromagnetic layers are either composed entirely of half-metallic material, or that relatively small quantities of other materials are present therein, whether deliberately added or originally present. For example, foreign materials may be added to the ferromagnetic layers in various minority quantities so as to intentionally influence their magnetic properties. More specifically, foreign materials such Ni, Co, Mn, Zn, Cu and Mg, for example, can be added to the ferromagnetic layers so as to influence their magnetic coercivity. The two ferromagnetic layers, of course, do not have to have the same composition, and may comprise different half-metallic materials.

It is of course possible to combine several inventive tiflayer structures into a multilayer arrangement. Alternatively, inventive trilayer structures and known trilayer structures can be combined together. In addition, besides containing the basic trilayer, the magneto-resistance device according to the invention may also comprise additional layers, such as oxidation-barriers, electrical contact layers, insulation layers, exchangebiasing layers, etc. It is also possible to embody the inventive magneto-resistance device so that there is more than one interposed non-ferromagnetic layer between consecutive ferromagnetic layers.

A beneficial embodiment of the magneto-resistance device according to the invention is characterised in that the half-metallic material is a metal oxide. Such a material is suitable for deposition by, for example, oxidic vacuum vapour deposition, oxidic sputter deposition or oxidic laser ablation deposition, whereby a pure metal or metal alloy is evaporated, sputtered or ablated in an oxidising atmosphere. Particularly advantageous metal oxides in this category are $Fe_3O_4$, $CrO_2$, and mixtures thereof. These materials are oxides of commonly occurring elements, and can be deposited by evaporating, sputtering or ablating Fe, Cr or an FeCr alloy.

A particularly advantageous embodiment of the inventive magneto-resistance device is characterised in that the non-ferromagnetic material is an electrical insulator. The term "insulator" as used in this context is intended to indicate that the bulk non-ferromagnetic material has an electrical resistivity characteristic of a non-conductor, but that, when embodied in a sufficiently thin layer, it can nevertheless be traversed with relative ease by tunnelling electrons (in a direction substantially perpendicular to the layer). Such an insulator preferably has a room-temperature electrical resistivity in excess of 0.01 $\Omega$m, and is preferably embodied in a layer of thickness 0.5–10 nm. Examples of electrical insulators suitable for this purpose are GdO, MgO, $MgAl_2O_4$ and $SrTiO_3$, among many others.

Such a device exploits tunnelling processes from occupied electron states on one side of the non-ferromagnetic tunnelling barrier to available (empty) electron states on the other side of the barrier. For a sufficiently thin barrier, the transfer of an electron from one ferromagnetic layer to the next ferromagnetic layer is determined solely by the electron states within these two layers, and is essentially independent of the interposed barrier itself.

Such independence is not necessarily guaranteed if the interposed nonferromagnetic material is an electrical conductor (such as, for example, Cu, Au, Cr, $LiTi_2O_4$, etc.). However, for a suitable match of materials in the ferromagnetic layers and the interposed non-ferromagnetic conductor layer, an inventive device comprising such a conductor layer can also demonstrate a very large magneto-resistance effect.

BRIEF DESCRIPTION OF THE DRAWING

The invention and its attendant advantages will be further elucidated with the aid of exemplary embodiments and the accompanying schematic drawings, not of uniform scale, whereby.

DETAILED DESCRIPTION OF THE PREFERRED EMBODIMENTS

Embodiment 1

Figure 1:
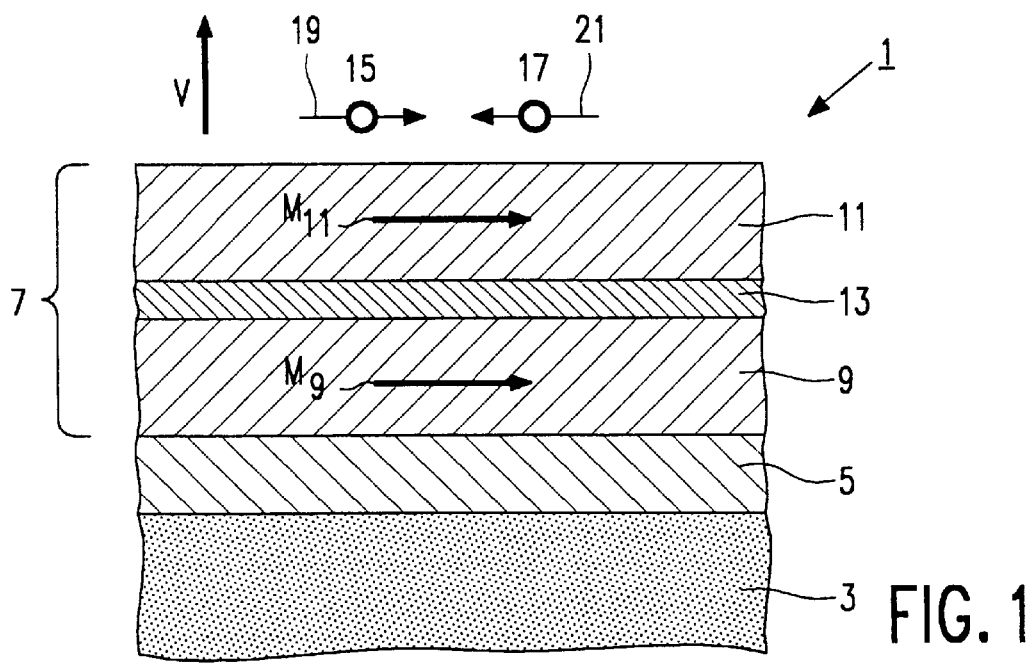
FIGS. 1 and 2 give a cross-sectional view of part of a magneto-resistance device embodied according to the invention.
Figure 2:
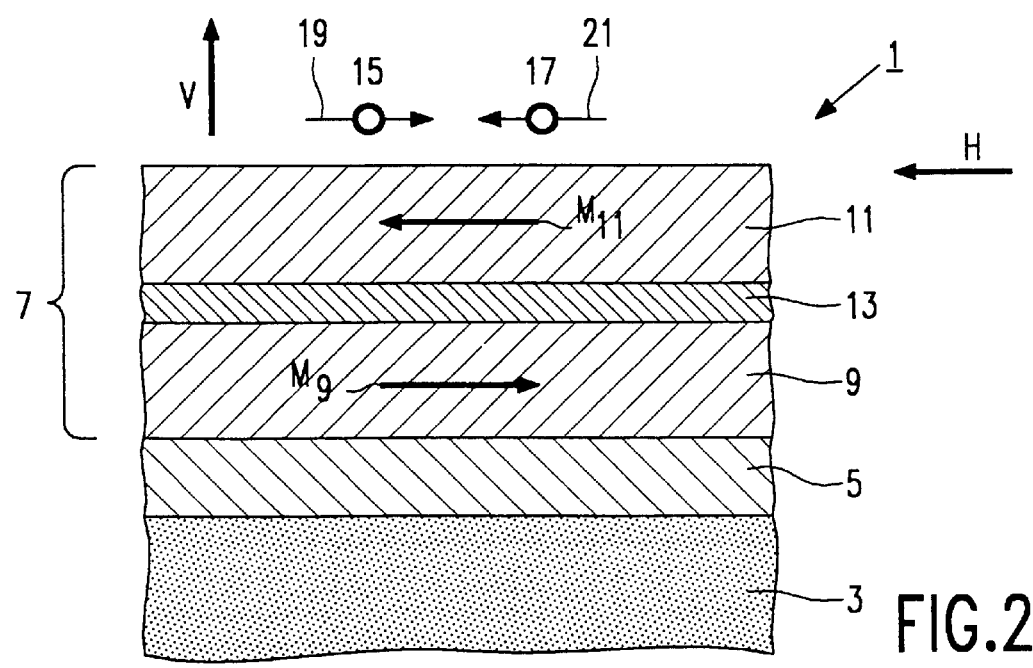

FIGS. 1 and 2 depict part of an embodiment of a magneto-resistance device 1 according to the invention, viewed in a cross-section taken perpendicular to the device's constituent layers. Identical parts in both Figures are referred to by the same reference labels.

A substrate 3 of MgO is provided with a NiO anti-ferromagnetic biasing layer 5, which is electrically insulating. Thereupon is located a trilayer structure 7, which consists of two electrically conducting half-metallic ferromagnetic $Fe_3O_4$ layers 9, 11 separated by a thin electrically insulating non-ferromagnetic GdO layer 13. The $Fe_3O_4$ layer 9 is exchange-biased to the NiO layer 5, so that the trilayer structure 7 is of type (b). The respective magnetisations $M_9$ and $M_{11}$ of the layers 9 and 11 are in-plane. An electrical voltage gradient V is applied across the structure in the depicted substantially perpendicular direction, so as to measure the electrical resistance of the structure 7 using the CPP geometry. The Figures also schematically show two electrons 15, 17 having (respective) opposite spins 19, 21.

FIG. 1 depicts the parallel magnetisation configuration observed in the absence of an external magnetic field, whereby magnetisations $M_9$ and $M_{11}$ are oriented in the same direction. In this configuration, the structure 7 acts as an electrical conductor, for the following reasons.

Since the spin 19 of electron 15 is parallel to both $M_9$ and $M_{11}$ (spin-up state), layers 9 and 11 will both act as electrical insulators for this electron. However, since the spin 21 of electron 17 is anti-parallel to both $M_9$ and $M_{11}$ (spin-down state), layers 9 and 11 will both behave as electrical conductors for this electron, so that it can traverse the entire structure 7 in a direction substantially perpendicular to layers 9 and 11 by tunnelling through the barrier 13. The CPP electrical resistance of the structure 7 will in this case have a low value, typically 10–100$\Omega$.

In FIG. 2, an appropriate external magnetic field H has been applied anti-parallel to $_{M9}$. This field H is strong enough to reverse the direction of $M_{11}$, without changing the direction of $M_9$. Layers 9 and 11 are thereby forced into anti-parallel magnetisation configuration. In this condition, the structure 7 acts as an electrical insulator, for the following reasons.

Electron 17 can exist as a conduction electron in layer 9, because its spin 21 is anti-parallel to $M_9$ (spin-down state). It can therefore traverse layer 9 in a direction substantially perpendicular thereto. However, it cannot behave as a conduction electron in layer 11, because its spin 21 is parallel to $M_{11}$, (spin-up state). Layer 11 therefore behaves as an electrical insulator with regard to electron 17. As a result, electron 17 cannot wholly traverse the structure 7 in a substantially perpendicular direction.

Similar arguments apply to electron 15, for which layer 9 will behave as an insulator and layer 11 will behave as a conductor. As a result, the CPP electrical resistance of the structure 7 will in this case be essentially infinite.

The magnitude of the CPP magneto-resistance effect in this embodiment is therefore practically 100%.

Embodiment 2

Figure 3:
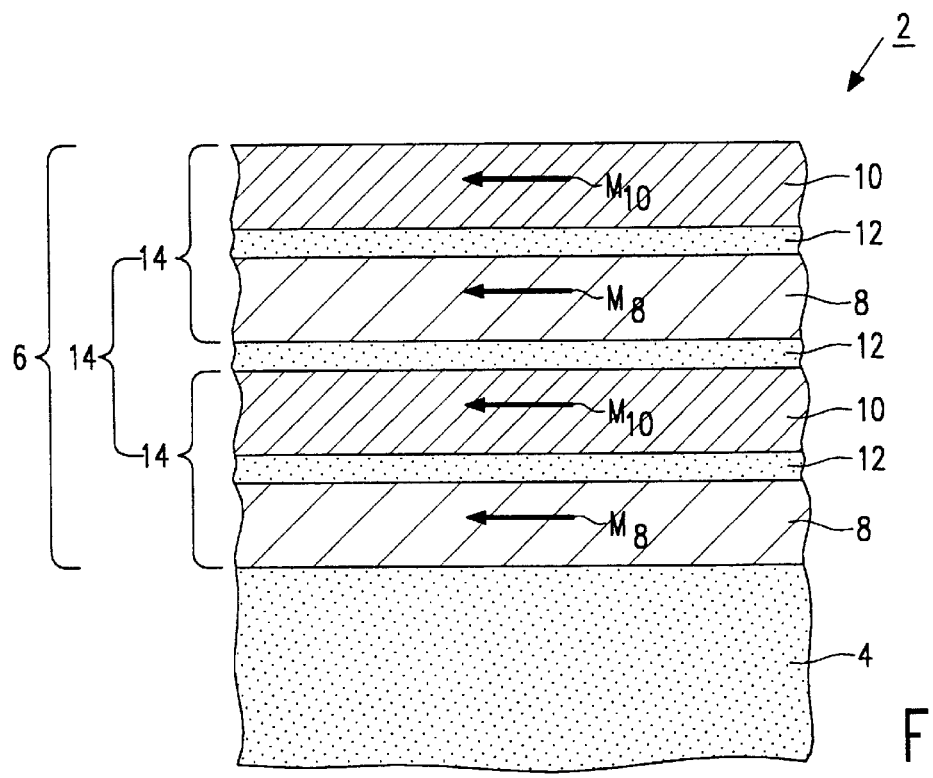
FIGS. 3 and 4 cross-sectionally depict part of another embodiment of a magneto-resistance device according to the invention.
Figure 4:
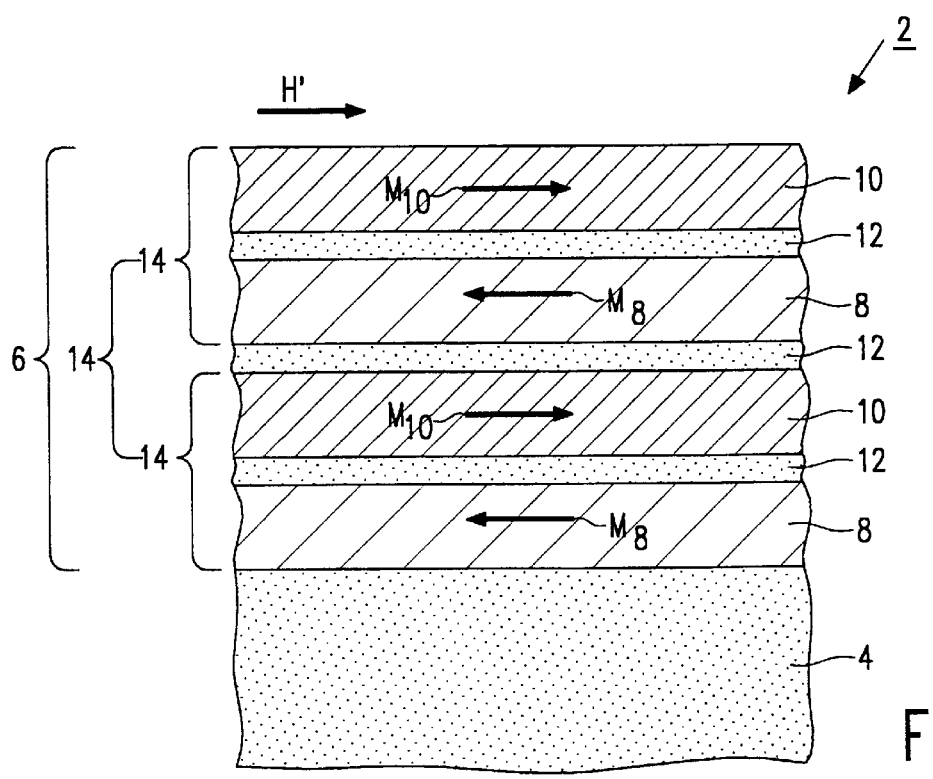

FIGS. 3 and 4 partially depict a magneto-resistance device 2 embodied according to the invention, when viewed in a cross-section taken perpendicular to the device's constituent layers. Identical parts in both Figures are labelled by the same reference numerals.

A substrate 4 of MgO is provided with a multilayer structure 6 consisting of half-metallic ferromagnetic layers 8, 10 alternately stacked with interposed thin insulating layers 12 of non-ferromagnetic MgO. The layers 12 act as tunnelling barriers between consecutive layers 8, 10. The layers 8 consist of essentially pure $Fe_3O_4$, but the layers 10 consist of $Co_{0.012}Fe_{2.988}O_4$ i.e. $Fe_3O_4$ lightly doped with Co. Addition of Co to $Fe_3O_4$ in this quantity causes considerable magnetic softening of the $Fe_3O_4$, so that the layers 10 are magnetically softer than the layers 8. The multilayer structure 6 therefore consists of a plurality of basic trilayer structures 14 of type (c). The magnetisations of the layers 8, 10 are in-plane, and are here respectively denoted by the arrows $M_8$ and $M_{10}$. The electrical resistance of the multilayer structure 6 is measured using the CPP geometry.

FIG. 3 depicts the magnetisation configuration in the absence of an external magnetic field, whereby the magnetisations $M_8$ and $M_{10}$ are aligned parallel to one another. In this configuration, the structure 6 acts as a conductor.

In FIG. 4, an external magnetic field H' has been applied in a direction anti-parallel to the magnetisations $M_8$. The magnitude of H' is such that the magnetisations $M_{10}$ are forced into parallel alignment therewith, but that the magnetisations $M_8$ retain their original orientation. In this anti-parallel magnetisation configuration, the structure 6 behaves as an insulator.

The CPP magneto-resistance effect of the device 2 is therefore practically 100%.

Embodiment 3

Figure 5:
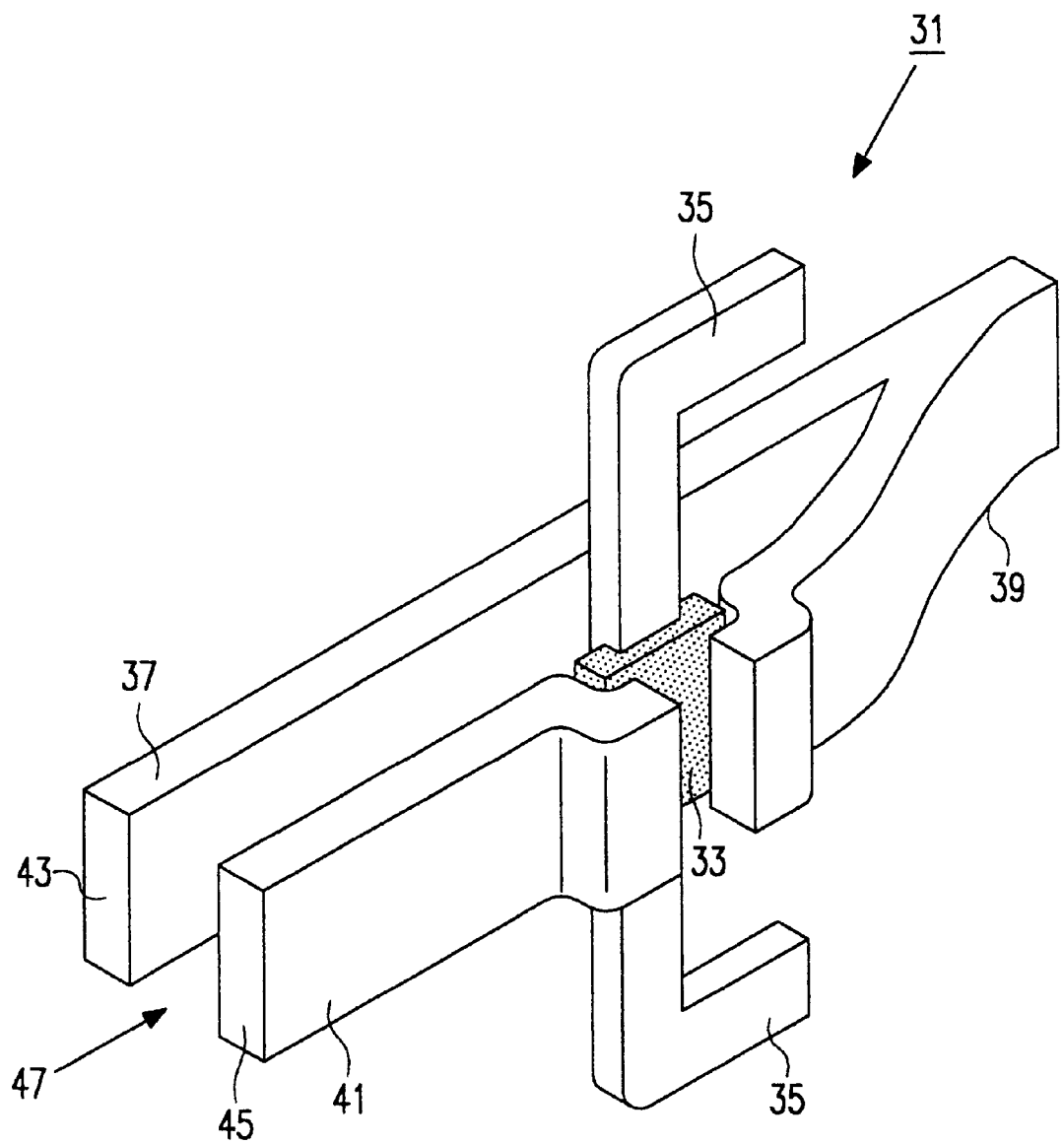
FIG. 5 is a perspective view of part of a magnetic head employing a magneto-resistance device according to the invention.

FIG. 5 is a schematic perspective view of part of a magnetic head 31 comprising an inventive magneto-resistance device 33 with electrical connections 35. The head 31 further comprises a substrate 37, which is comprised of a magnetic material (such as a ferrite) or of a non-magnetic material on which a layer of magnetic material (such as NiFe) is deposited. The head 31 additionally comprises flux guides 39, 41, which are positioned relative to the device 33 and the substrate 37 so as to form a magnetic circuit. The end faces 43, 45 form part of the pole face of the magnetic head 31, the magnetic gap 47 being located between said faces 43, 45.

If a magnetic medium, such as a magnetic tape or disc, passes before the faces 43, 45 in close proximity thereto, the magnetically-stored information on that medium will generate a varying magnetic flux in the above-mentioned magnetic circuit, which magnetic flux is also fed through the magneto-resistance device 33. The device 33 transcribes this varying magnetic flux into electrical resistance variations, which can be measured via the electrical connections 35.

The magnetic head may also contain an electrical coil, which can be employed in the recording of magnetic information on magnetic media.

Embodiment 4

In addition to possible employment in a magnetic field sensor (such as a magnetic head), the magneto-resistance device in accordance with the invention can also be applied as an electrical switch, and specifically as an electrical relay. In such an application, an external magnetic field is deliberately applied to the device in order to change its electrical behaviour. For example, the device can be furnished with means for controllably generating a magnetic field (e.g. via an electrical coil), and such a field can then be invoked at chosen times in order to influence the electrical current flow through the device. In particular, by passing an appropriate electrical current through an electrical conductor (such as a coil, loop or straight wire) positioned in proximity to the device, the magnetic field thereby generated can be used to controllably change the magnetisation configuration in the device, thus allowing it to be switched between high-resistance and low-resistance states. In such an embodiment, the device can be employed as an electrical relay.

What is claimed is:

1. A magneto-resistive device comprising two layers of ferromagnetic material mutually separated essentially only by at least one layer of a non-ferromagnetic material, characterized in that said at least one layer of non-ferromagnetic material is electrically insulating and is in contact with one of said layers of ferromagnetic material and at least one of the layers of ferromagnetic material comprises a half-metallic material.

2. A magneto-resistance device according to claim 1, characterised in that both ferromagnetic layers are principally comprised of half-metallic material.

3. A magneto-resistance device according to claim 2, characterised in that the half-metallic material is a metal oxide.

4. A magnetic head comprising a magneto-resistance device as claimed in claim 2.

5. A magneto-resistance device according to claim 1, characterised in that the half-metallic material is a metal oxide.

6. A magneto-resistance device according to claim 3, characterised in that the half-metallic material is selected from the group formed by $Fe_3O_4$, $CrO_2$, and mixtures thereof.

7. A magnetic head comprising a magneto-resistance device as claimed in claim 6.

8. A magnetic head comprising a magneto-resistance device as claimed in claim 5.

9. A magnetic head comprising a magneto-resistive device as claimed in claim 1.

* * * * *